United States Patent [19]
Uchikoga et al.

[11] Patent Number: 5,614,731
[45] Date of Patent: Mar. 25, 1997

[54] THIN-FILM TRANSISTOR ELEMENT HAVING A STRUCTURE PROMOTING REDUCTION OF LIGHT-INDUCED LEAKAGE CURRENT

[75] Inventors: Shuichi Uchikoga, Kawasaki; Nobuki Ibaraki, Kanagawa-ken; Kouji Suzuki; Takuya Shimano, both of Yokohama; Kaichi Fukuda, Sagamihara, all of Japan

[73] Assignee: Kabushiki Kaisha Toshiba, Kanagawa-ken, Japan

[21] Appl. No.: 514,124

[22] Filed: Aug. 11, 1995

Related U.S. Application Data

[63] Continuation-in-part of Ser. No. 209,929, Mar. 14, 1994, abandoned.

[30] Foreign Application Priority Data

Mar. 15, 1993 [JP] Japan ................... 5-054019

[51] Int. Cl.$^6$ .................. H01L 29/04; H01L 31/036; H01L 31/0376; H01L 31/20
[52] U.S. Cl. ................. 257/59; 257/61; 257/350; 257/352; 349/42; 349/158
[58] Field of Search ................. 257/57, 59, 60, 257/61, 72, 347, 350, 352, 353; 359/57, 59, 82

[56] References Cited

U.S. PATENT DOCUMENTS

| | | | |
|---|---|---|---|
| 5,051,800 | 9/1991 | Shoji et al. | 357/30 |
| 5,559,344 | 9/1996 | Kawachi | 257/57 |

FOREIGN PATENT DOCUMENTS 61-204976  9/1986  Japan .

*Primary Examiner*—Ngàn V. Ngò
*Attorney, Agent, or Firm*—Finnegan, Henderson, Farabow, Garrett & Dunner, L.L.P.

[57] ABSTRACT

A thin-film semiconductor element provided on a channel area with a channel protection layer, characterized by the fact that a source electrode layer and a drain electrode layer respectively have overlapping areas on the channel protection layer, the side walls of the source electrode layer and the drain electrode layer extend in the overlapping areas beyond the side wall of the channel protection layer in at least one direction of the width thereof, and the source electrode layer and the drain electrode layer possess points of overlap intersection with the semiconductor layer at the points of overlap intersection thereof with the channel protection layer. Owing to the construction described above, the leakage current generated by exposure to light can be decreased and the thin-film semiconductor element can be produced by a simple process of manufacture.

15 Claims, 9 Drawing Sheets

THIN-FILM TRANSISTOR ELEMENT HAVING A STRUCTURE PROMOTING REDUCTION OF LIGHT-INDUCED LEAKAGE CURRENT

The present application is a continuation-in-part of U.S. patent appln. Ser. No. 08/209,929, filed Mar. 14, 1994, now abandoned the specification and drawings of which are hereby expressly incorporated by reference.

BACKGROUND OF THE INVENTION

This invention relates to a thin-film semiconductor element and particularly to the construction of a thin-film semiconductor element to be used as in an active matrix type liquid crystal display device.

In recent years, thin-film transistors (hereinafter referred to briefly as "TFT") have been copiously used as components as for active matrix type liquid crystal display devices and image sensors. As a natural consequence, the desirability of developing a TFT capable of manifesting improved semiconducting characteristics when used in liquid crystal display devices has been finding recognition.

The construction of the conventional TFT represented by a bottom-gate staggered type TFT will be described below with reference to FIG. 2. FIG. 2A is a plan view, FIG. 2B a cross section taken through FIG. 2A along a line II—II, and FIG. 2C a cross section taken through FIG. 2A along a line IV—IV.

An insulating substrate 7 made of glass is overlaid by a gate electrode layer 3 and further overlaid sequentially by a gate insulation layer 4, a semiconductor layer 5, and a channel protecting layer 1 in the order mentioned. After the channel protecting layer 1 has been formed so as to obtain a predetermined channel length, a contact layer 6, a source electrode layer 2, and a drain electrode layer 2 are formed. The source electrode layer and the drain electrode layer per se are short-circuited by the contact layer 6. The contact layer 6 on the channel protecting layer 1, therefore, is removed as masked by the source electrode layer 2 and the drain electrode layer 2. Here, the source electrode layer 2 and the drain electrode layer 2 are formed with a width narrower than the width of the channel protection layer 1. This statement equals the expression $W_0 > W_1$ wherein $W_1$ stands for the width of the source electrode layer or drain electrode layer and $W_0$ for the width of the channel protection layer. The reason for this relation is that the resistance between the source electrode layer and the drain electrode layer must be lowered by giving a greater width to the channel layer. Further, for the purpose of ensuring the protection of the channel layer, it is necessary that the alignment of the component layers should be facilitated by allowing the channel protection layer to have a greater width.

These problematic points of the conventional TFT will be described below with reference to the application of this TFT to an active matrix type liquid crystal display device.

The TFT functions as a switching element for selectively addressing electric charges in the pixels arranged in a matrix pattern. It is, therefore, required to be capable of amply addressing electric charges in the pixels while in the ON state and retaining electric charges already addressed in the pixels for a required duration while in the OFF state. As a natural consequence, it is important that the TFT should be furnished with an ample ON/OFF ratio for the sake of fulfilling the switching function. The TFT used in a transmissive type liquid crystal display device is exposed to incident light on account of the operating principle. The TFT used in the reflective type liquid crystal display device is similarly exposed to incident light. The TFT which uses amorphous silicon or polycrystalline silicon, therefore, gives birth to carriers excited by light and tends to generate a leakage current particularly in the OFF state. The idea of lowering the magnitude of the leakage current generated during the OFF state and consequently securing an ample ON/OFF ratio has now become an essential technique for the TFT. If no large ON/OFF ratio is secured, the pixels in the case of a normally white mode, for example, become white and are perceived as a defect of the display device. When the TFT is used in a state inevitably exposed to incident light by reason of construction or environment of use as when it is used for a liquid crystal display device, the defective display due to such a decline of the ON/OFF ratio of the TFT as mentioned above tends to occur.

As a measure to lower the magnitude of the leakage current and secure an ample ON/OFF ratio, the provision of a black matrix or a shielding layer aimed at keeping the TFT from exposure to an incident light is now under contemplation. Also, the feasibility of a method for increasing the storage capacity of an pixel electrode to the extent of rendering the leakage current of the TFT negligible has been contemplated. U.S. Pat. No. 5,051,800 discloses a method which comprises using a shielding layer formed of a source electrode layer and a drain electrode layer for the sake of preventing impingement of light on the semiconductor layer.

When a black matrix of the conventional construction is disposed on the counter electrode side, however, since the black matrix and the TFT are separated by an intervening gap of several μm and a liquid crystal composition is interposed between their opposed surfaces, the backlight and the light emanating from the environment around the display device are caused to impinge on the TFT owing to their diffused reflective inside the liquid crystal device. Though the method which resorts to enlargement of the area of a black matrix has been known to the art, it decreases the aperture ratio of the liquid crystal display device and induces deterioration of the quality of image. In the case of the method which resides in disposing a light shielding layer directly on the TFT, the shielding layer affects the operation of the TFT with its potential and, therefore, renders the decision of this potential difficult and entails the possibility of forming a short circuit between the shielding layer and the TFT. It also increases the number of steps of the process of production and complicates the construction of the device. It, therefore, has a problem of degradation of the yield of production of devices using the TFT.

The method which resorts to enlargement of the storage capacity of an pixel electrode entails a problem of degradation of the aperture ratio of a liquid crystal display device and a problem of necessity of imparting to the TFT high mobility for enabling electric charges to be addressed in pixels proportionately to the enlargement of the storage capacity.

The method which uses a shielding layer formed of a source electrode layer and a drain electrode layer for the sake of preventing impingement of light on the semiconductor layer has a problem of inability to lower the leakage current sufficiently because the semiconductor layer touches the source electrode layer and the drain electrode layer through the medium of a contact layer at the leading end of the shielding layer in the channel area.

The conventional techniques, as described above, are at a disadvantage in not easily lowering the leakage current of the TFT with efficiency.

SUMMARY OF THE INVENTION

As described above, the conventional techniques have been unable to lower easily the leakage current of the TFT with efficiency.

One object of this invention is to obtain a TFT which is capable of decreasing the leakage current due to exposure to light.

Another object of this invention is to obtain the TFT capable of decreasing the leakage current by a simplified process of production.

Yet another object of this invention is to obtain a liquid crystal display device or an image sensor possessed of excellent quality by the use of the TFT mentioned above.

The TFT of this invention can be applied to the so-called or top gate type TFT.

A thin-film semiconductor element comprising a substrate, a gate electrode layer formed on the substrate, a channel area comprised of a semiconductor layer formed on the gate electrode layer through the medium of an insulating layer, a channel protection layer formed on the channel area, and a source electrode layer and a drain electrode layer electrically interconnected through the medium of the channel area, wherein the source electrode layer and the drain electrode layer respectively have overlapping areas on the channel protection layer, at least one of a side walls of the source electrode layer and the drain electrode layer extends beyond a side wall of the channel protection layer, and the source electrode layer and the drain electrode layer possess points of overlap intersection with the semiconductor layer at the points of overlap intersection thereof with the channel protection layer.

A thin-film semiconductor element comprising a substrate, a source electrode layer and a drain electrode layer superposed on said substrate as separated by a predetermined distance, a channel area comprised of a semiconductor layer and disposed through the medium of a protection layer formed on said predetermined distance, a gate insulation layer disposed on said channel area, and a gate electrode layer formed on said gate insulation layer, wherein said source electrode layer and said drain electrode layer respectively have overlapping areas on said channel protection layer, at least one of a side walls of said source electrode layer and said drain electrode layer extends beyond the side wall of said channel protection layer, and said source electrode layer and said drain electrode layer possess points of overlap intersection with said semiconductor layer at the points of overlap intersection thereof with said channel protection layer.

Now, the bottom-gate staggered type TFT of this invention will be described below with reference to FIG. 1A through FIG. 1E.

On a transparent substrate 7, a gate electrode layer 3, a gate insulation layer 4, a semiconductor layer 5, and a channel protection layer 1 are superposed. Further thereon, a source electrode layer 2 and a drain electrode layer 2 electrically connected to the semiconductor layer 5 are superposed through the medium of a contact layer 6.

The source electrode layer 2 and the drain electrode layer 2 respectively have areas in which they overlap the channel protection layer 1. The overlap is in such a manner that the side walls of the source electrode layer 2 and the drain electrode layer 2 extend beyond the side wall of the channel protection layer 1 in at least one direction of the width thereof (the direction perpendicular to the direction in which the source electrode layer and the drain electrode layer are opposed to each other). The overlap, therefore, may cover one side wall or both side walls of the channel protection layer. When the electrode width $W_1$ of the source 2 and drain 2 is larger so much than the width $W_0$ of the channel protection layer 1 that the source electrode layer 2 and the drain electrode layer 2 overlap both the side walls as illustrated in FIG. 1A, this overlap proves desirable in the sense that the leakage current at the TFT can be decreased. When the overlap is such as to cover one side wall as illustrated in FIG. 1E, the parasitic capacity of the TFT can be lowered.

The statement that the source electrode layer and the drain electrode layer have, at the points of overlap intersection thereof with the channel protection layer, points of overlap intersection thereof similarly with the semiconductor layer means that the source electrode layer 2 and the drain electrode layer 2 contact directly, namely not through the medium of the contact layer 6, the semiconductor layer 5 at the points III of overlap intersection of the source electrode layer 2 and the drain electrode layer 2 with the channel protection layer 1 as Illustrated in FIG. 1C and FIG. 1D. The point III in FIG. 1A, the top plan view, is the point the electrode layer 2 is crossed with the semiconductor layer 5. The point III in FIG. 1D, the cross section, is the point the electrode layer 2 is crossed with the semiconductor layer 5. By this construction, the leakage current can be decreased to a great extent. In the construction, the source electrode layer 2 and the drain electrode layer 2 may be formed of a low-resistance semiconductor layer or a metal layer or a composite formed of the two layers.

The phenomenon that the leakage current is greatly decreased by the construction of this invention will be described below with reference to FIG. 3A through FIG. 3C. FIG. 3B is different from FIG. 3A in respect that the portion of the semiconductor layer 5 which extends beyond the channel area is removed by etching.

This invention has been produced based on a new knowledge that the magnitude of the leakage current is largely affected by the presence or absence of a leakage current path produced by exposure to light. The TFT of this invention, therefore, is so constructed as to block the leakage current path which is produced by exposure to light.

In the liquid crystal display device or the image sensor, amorphous silicon is used more often than not as a material for a semiconductor layer capable of being deposited on a large surface at a low cost. The amorphous silicon by nature assumes electroconductivity on exposure to light. When a leakage current path happens to occur between the source electrode layer and the drain electrode layer, therefore, a leakage current flows to the channel area which would otherwise be controlled inherently by a gate potential. In the conventional construction, a leakage current path exists because the semiconductor layer 5 and the contact layer 6 directly contact each other as shown in FIG. 2C. In the case of the TFT which is constructed as shown in FIG. 3A, the exposure to light gives rise to leakage current paths of A→B, A'→B', C→D, and C'→D'. In the case of the construction shown in FIG. 3B, the leakage current paths so formed are A→B and A'→B'. In the leakage current paths A→B and A'→B', since the point A (or A') and the point B (or B') are points of contact between areas caused to assume high electroconductivity by exposure to light (hatched areas) and the contact layer 6, a leakage current flows through these paths when a potential difference occurs between the source electrode layer and the drain electrode layer. In the case of the construction shown in FIG. 3A, when the semiconductor layer 5 persists outside the channel area as found in the leakage current path C→D, the leakage current is much greater than that in the construction of FIG. 3B because the semiconductor layer contacts the contact area across such lines as AC and BF.

In FIG. 3C illustrating a plan view of the construction of the TFT of this invention, though the hatched area assumes high electroconductivity in consequence of exposure to light, no point of contact exists between this area and the contact layer. In FIG. 1C which illustrates a cross section of the construction of the TFT of this invention, the semiconductor layer 5 exclusively contacts the source and the drain electrode 2 across the thickness of wall and does not directly contact the contact layer 6. By adopting the construction contemplated by this invention, therefore, the blacking of the leakage current path can be attained. As a result, the magnitude of the leakage current caused by the exposure to light can be decreased.

The phenomenon that a photo-carrier is not moved through the channel area by the construction of this invention will be described below with reference to FIG. 3F and 3G.

The contact layer 6 is divided into two portions, a portion 25 contacted to the channel protection layer and a portion 26 contacted to the semiconductor layer 5. Under the principle upon which the TFT operates, the contacts of the contact layer 26 and the semiconductor layer 5 relate to a current path of a carrier.

Current flows between source drains only through the contacts based on the principle.

Next, a case that the TFT of the present invention is irradiated a light is considered. A portion 23 in FIG. 1F shows an area where a photo-carrier is induced when the TFT of the present invention is irradiated a light. A photo-carrier is induced where the semiconductor layer is not concealed in the source drain electrode 2.

The channel protection layer 1 is usually electrically insulated. For example, a silicon nitride film or a silicon oxide film is used. These films are transparent to a visible light, therefore, a photo-carrier is induced in the semiconductor layer 5.

On the other hand, the semiconductor layer under the area where the channel protection layer 1 and the source drain electrode 2 are overlapped is concealed behind the source drain electrode, therefore, a photo-carrier is not induced.

In a photo-carrier induced area, the TFT has low resistance even if it is in an off state, then it causes a leakage current.

In the structure of the present invention, if a low resistance area is generated in the semiconductor layer by irradiation of light, it does not flow a leakage current. The reason will be described using FIG. 1G. FIG. 1G is a schematic view of the carrier induced status in the semiconductor layer having no source drain electrode, contact layer and channel protection layer compared to FIG. 1A.

Here, the off state is considered. The semiconductor layer 5 has three areas. They are low resistance area 23 where a photo-carrier is excited by irradiation of light, a high resistance area 24 without light irradiation where the TFT is in a off state, and the contacts area 27.

To flow the leakage current between the source drain electrodes requires a point of contact between the low resistance area 23 by irradiation of light and the contact area 27. In FIG. 1G, if the low potential source on the left hand and the high potential drain on the right hand are existed, a carrier electron moves from the source to the drain. However, in the present invention, because the high resistance semiconductor area 24 where light irradiation is blocked by the source drain electrode 2 is existed between the contact area 27 and the low resistance area 23 by irradiation of light, a carrier never flows between the source and the drain, therefore, the leakage current is not produced.

Further, owing to this construction, the manufacture of the TFT can be attained without increasing the number of steps of the process of manufacture or complicating the process of manufacture as compared with the conventional TFT. When the TFT of this invention is used in a liquid crystal display device, the produced liquid crystal display device enjoys excellent quality of display.

The accompanying drawings, which are incorporated in and constitute a part of this specification, illustrate several embodiments of the invention and, together with the description, serve to explain the principles of the invention.

DESCRIPTION OF THE PREFERRED EMBODIMENTS

Figure 1A:
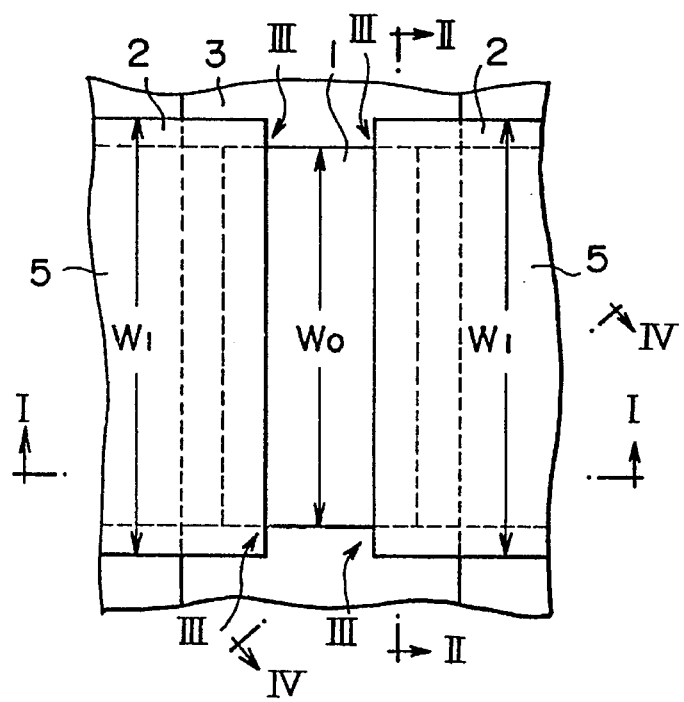
FIG. 1A is a plan view of a TFT of this invention.
Figure 1B:
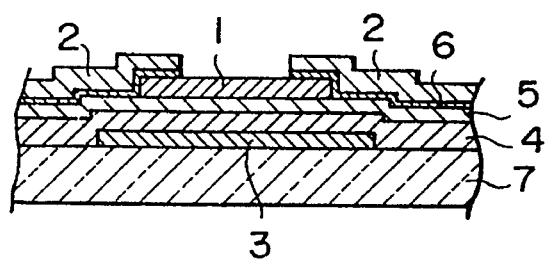
FIG. 1B is a cross section taken through FIG. 1A across the line I—I.
Figure 1C:
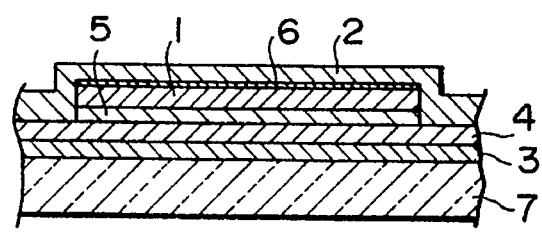
FIG. 1C is a cross section taken through FIG. 1A across the line II—II.
Figure 1D:
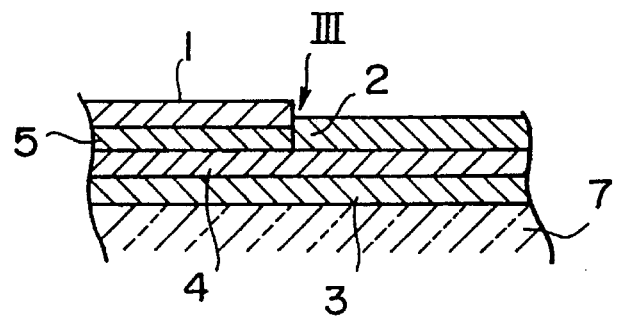
FIG. 1D is a cross section taken through FIG. 1A across the line IV—IV.
Figure 1E:
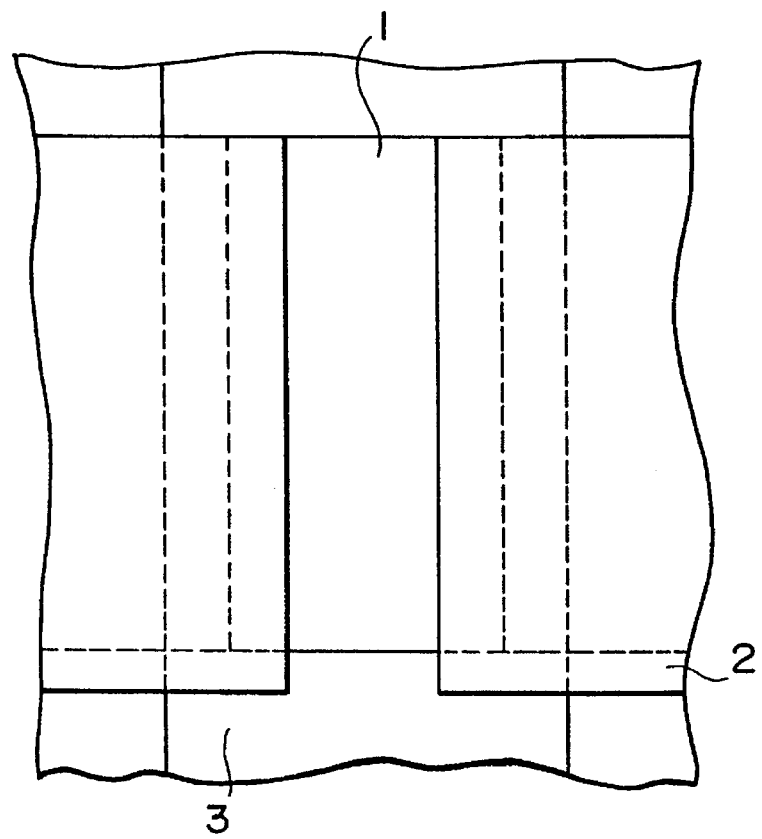
FIG. 1E is a plan view illustrating a source electrode layer and a drain electrode layer overlapping only one side wall of a channel protection layer.
Figure 1F:
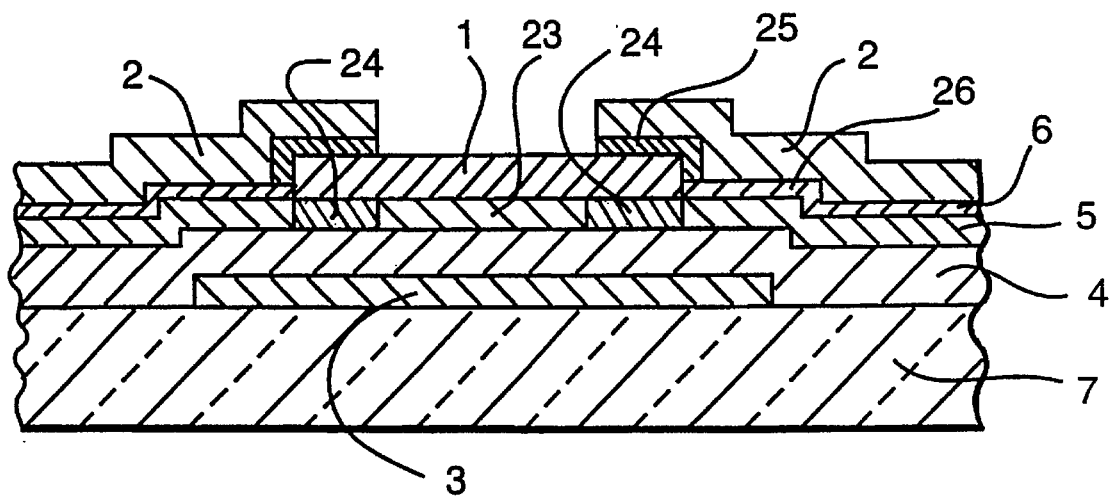
FIG. 1F is a cross section taken through FIG. 1A across the line I—I, and illustrating the state of semiconductor layer and contact layer.
Figure 1G:
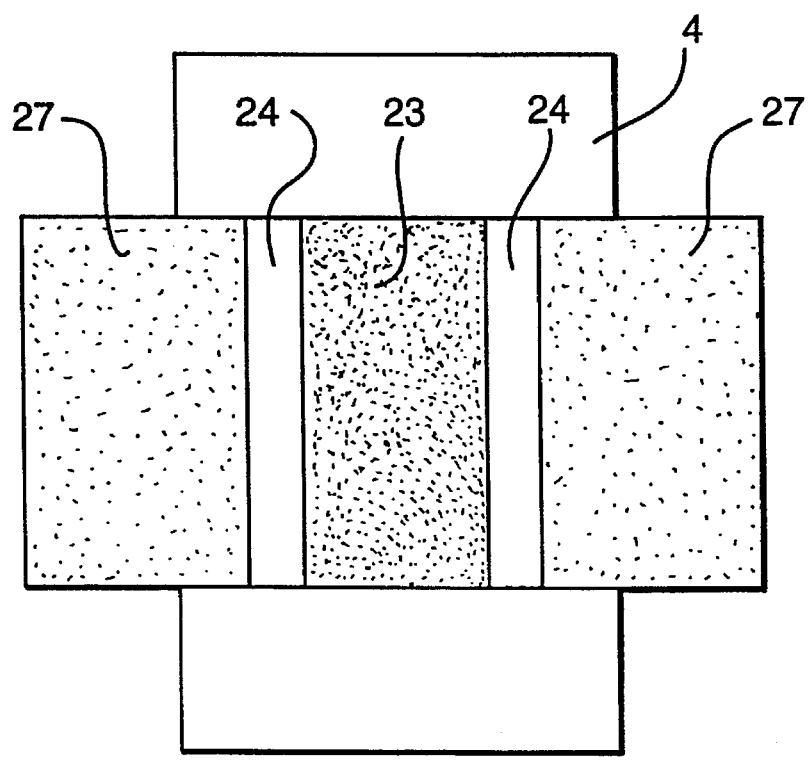
FIG. 1G is a schematic view of the carrier induced status in the semiconductor layer.

Reference will now be made in detail to the present preferred embodiments of the invention, examples of which are illustrated in the accompanying drawings. Wherever possible, the same reference numbers will be used throughout the drawings to refer to the same or like parts.

Embodiment 1

Now, the bottom-gate staggered type TFT of this invention will be described specifically below with reference to FIG. 1A through FIG. 1D.

A gate electrode layer 3 is formed an a substrate 7. When the TFT under discussion is to be used in a liquid crystal display device, such a transparent substrate of glass or quartz is used as the raw material for the substrate 7. For the gate electrode layer 3, a simple layer of molybdenum (Mo), tantalum (Ta), or aluminum (Al), alloys thereof, for example, MoTa alloy, or a laminated film using such metals is used as the raw material and is formed in a desired shape by means of plasma etching or wet etching.

Then, a gate insulation layer 4, a semiconductor layer 5, and a channel protection layer 1 are sequentially superposed thereon in the order mentioned. Specifically, the following case may be cited. As the material for the gate insulation layer 4, a silicon nitride film ($SiN_x$), a silicon oxide film ($SiO_x$), or a superposed film of a silicon nitride film and a silicon oxide film is used. For the lamination, the plasma CVD method may be used, for example. Amorphous silicon, for example, is used as the material for the semiconductor layer 5 and a silicon nitride film or a silicon oxide film, or the like, is used as the material for the channel protection layer 1. After the superposed film has been deposited, the channel protection layer 1 is formed so as to acquire a desired channel length. Then, as a contact layer 6, an n+ contact layer doped with such an impurity substance as phosphorus (P) is deposited. For the sake of device separation, the semiconductor layer 5 and the contact layer 6 are subjected to a patterning treatment. The channel width of the TFT is decided during this patterning treatment. During the formation of the channel protection layer 1, this layer 1 is desired to be formed in a size larger than the actual channel width with due allowance far relaxation of the accuracy of registration of patterning. At the step of etching for device separation, the etching of the channel protection layer 1 is simultaneously carried out because the channel protection layer 1 has been formed in a size larger than the desired channel width. The simultaneous etching of this nature can be easily realized by adopting an etching method which has no selectivity between the channel protection layer 1 and the semiconductor layer 5. When a silicon nitride film is used for the channel protection layer 1 and amorphous silicon for the semiconductor layer 5, for example, it is desirable to adapt the dry etching method using a mixed gas of perfluoromethane ($CF_4$) with oxygen ($O_2$) as the etching method.

Subsequently, a source electrode layer 2 and a drain electrode layer 2 are formed. As the material for the source electrode layer and the drain electrode layer electrode, a layer of molybdenum (Mo), chromium (Cr), or aluminum (Al) or a superposed layer of such metals can be used. The electrode layer is so formed that the width of the source electrode layer 2 and the drain electrode layer 2 ($W_1$) relative to the direction of channel width of the channel protection layer 1 ($W_0$) fulfills the relation, $W_0<W_1$, as illustrated in FIG. 1A. Thereafter, the contact layer 6 is removed by etching with the source electrode layer 2 and the drain electrode layer 2 kept under a mask.

Figure 2A:
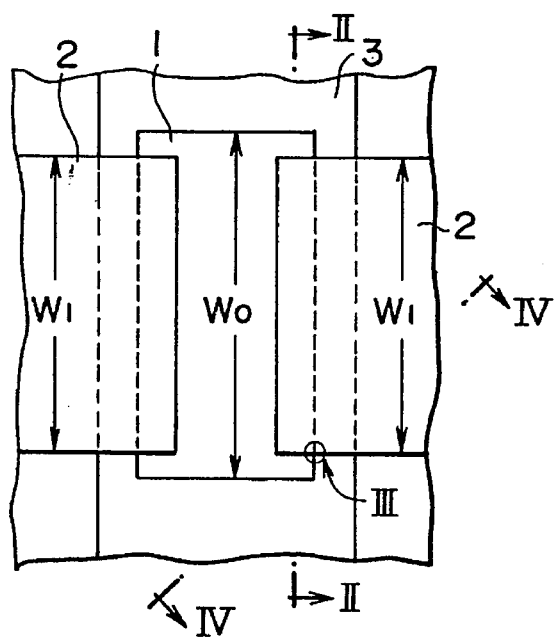
FIG. 2A is a plan view of the conventional TFT.
Figure 2B:
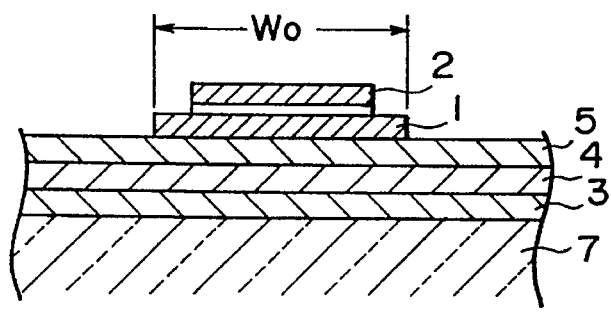
FIG. 2B is a cross section taken through the TFT of FIG. 2A across the line II—II.
Figure 2C:
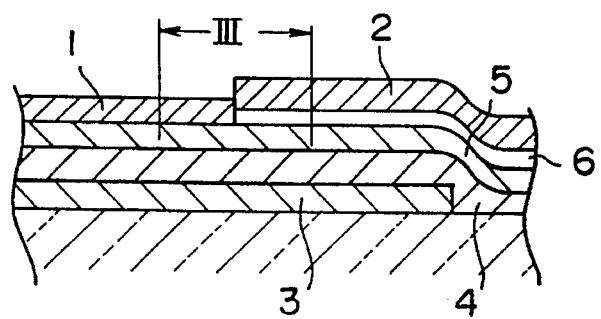
FIG. 2C is a cross section taken through the TFT of FIG. 2A across the line IV—IV.
Figure 3A:
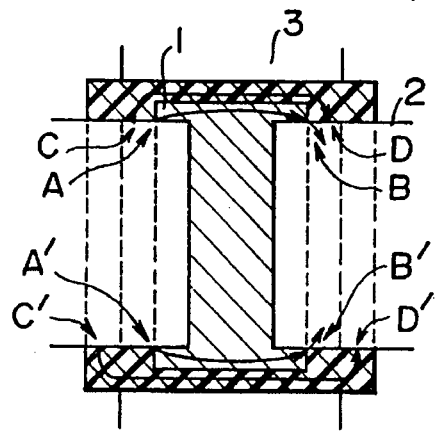
FIG. 3A is a diagram for aiding in the description of a leakage current path in the conventional TFT.
Figure 3B:
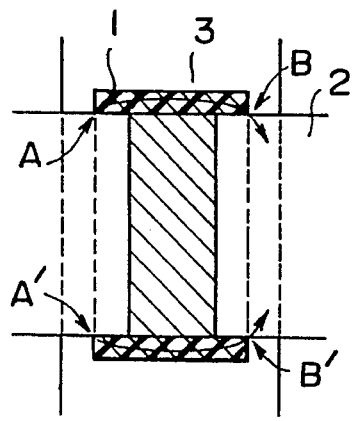
FIG. 3B is a diagram for aiding in the description of a leakage current path in the conventional TFT.
Figure 3C:
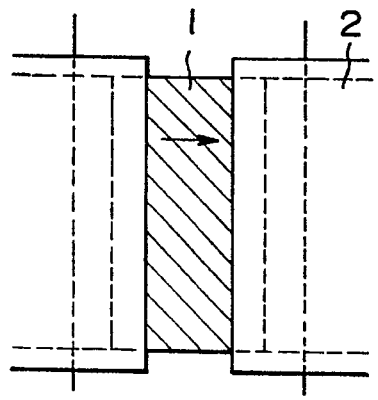
FIG. 3C is a diagram for aiding in the description of a leakage current path in the TFT of this invention.

The construction of the TFT of the present Embodiment produced as described above is characterized, as compared with the construction of the conventional TFT illustrated in FIG. 2A through FIG. 2C, by the fact that the source electrode layer 2 and the drain electrode layer 2 have a larger width than the channel protection layer 1, the semiconductor layer 5, and the contact layer 6 relative to the direction of channel width. This Embodiment satisfies $W_0<W_1$, whereas the conventional TFT fulfills $W_0>W_1$. Thus, the present Embodiment neither increases the number of steps of the process of manufacture nor complicates the process of manufacture.

Figure 4A:
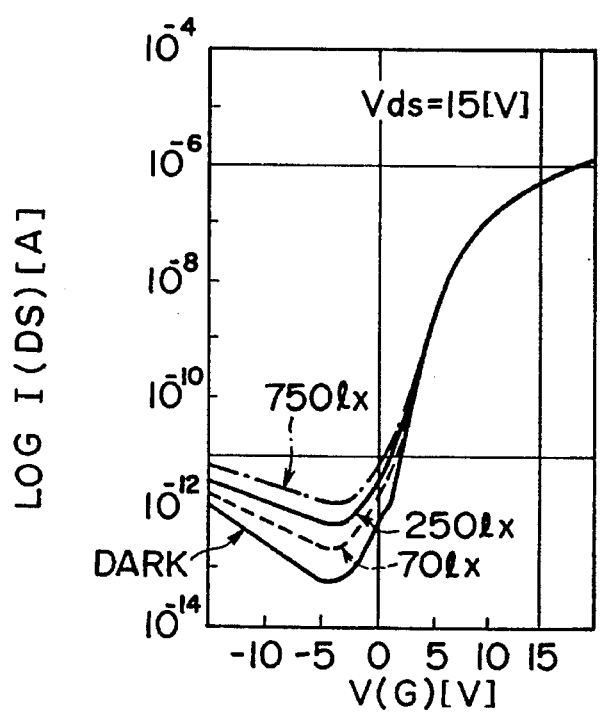
FIG. 4A is an $I_d$-$V_g$ characteristic diagram of the TFT of Embodiment 1.
Figure 4B:
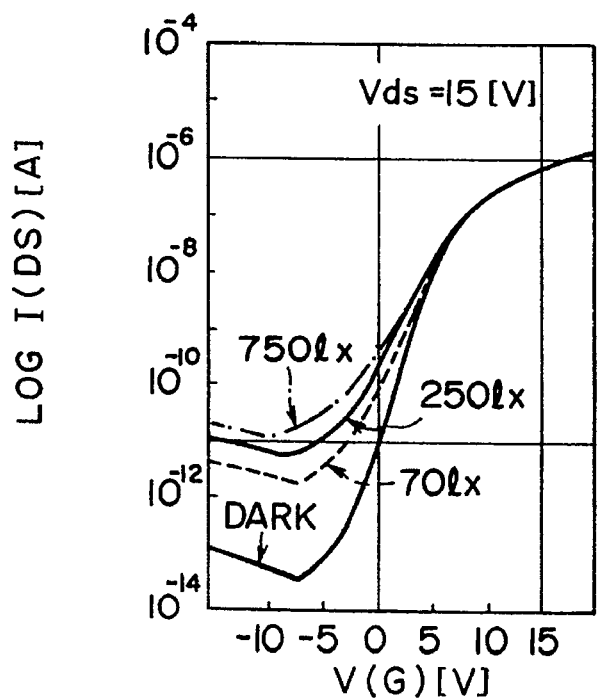
FIG. 4B is an $I_d$-$V_g$ characteristic diagram of the conventional TFT.

The $I_d-V_g$ characteristic of the TFT of the present Embodiment is illustrated in FIG. 4A. For comparison, the $I_d-V_g$ characteristic of the conventional TFT is illustrated in FIG. 4B. The $I_d-V_g$ characteristic represents the case of projecting light of 70 lx, 250 lx, and 750 lx from the source and the drain electrode side of the TFT and the case of projecting no light. Comparison of the magnitudes of electric current at the gate voltage 0 [V] reveals that the magnitudes of leakage current of the TFT of this Embodiment are evidently small for the relevant amount of light for illumination. Use of this TFT permits production of a liquid crystal display device excelling in grade of display.

Figure 5A:
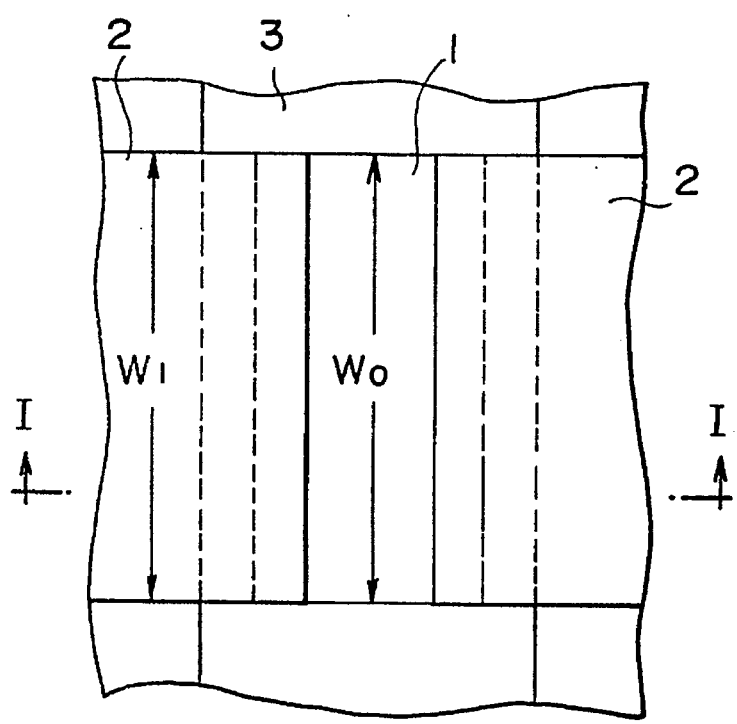
FIG. 5A is a diagram illustrating a special case in Embodiment 1.
Figure 5B:
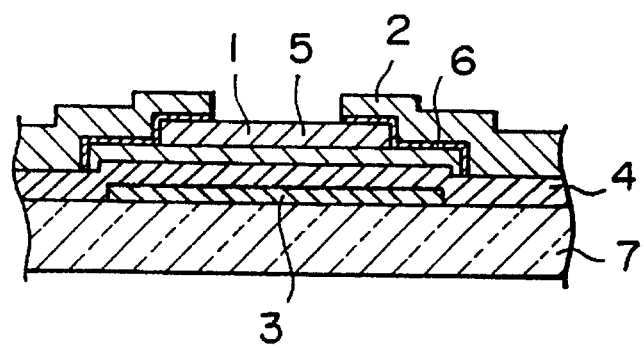
FIG. 5B is a cross section taken through FIG. 5A across the line I—I.
Figure 6A:
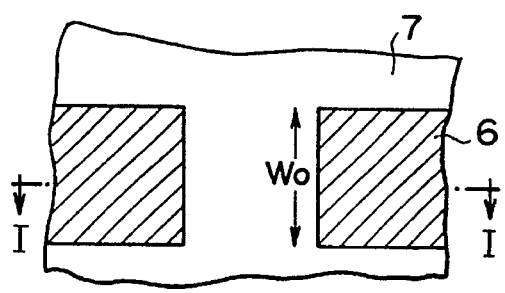
FIG. 6A is a plan view illustrating a step 1 for the formation of a TFT of Embodiment 3.
Figure 6B:
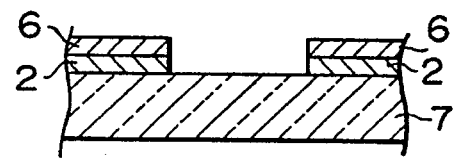
FIG. 6B is a cross section taken through FIG. 6A across the line I—I.

The construction illustrated in FIG. 5A and FIG. 5B is a special example of the construction of the TFT construction of this Embodiment. The construction of FIG. 5A has this relation $W_0=W_1$. As a natural consequence, the contact layer 6 and the semiconductor layer 5 are exposed in the cross section. The TFT of this construction, therefore, does not easily acquire a satisfactory characteristic because the contact layer 6 and the semiconductor layer 5, while the contact layer 6 between the source electrode layer 2 and the drain electrode layer 2 is being etched, are etched from the terminal parts thereof to the extent of entailing deterioration of the source electrode layer-drain electrode layer contact part. It is logically concluded, therefore, that the relation $W_0=W_1$ is not desirable and the relation $W_0<W_1$ is desirable.

Embodiment 2

Now, an Embodiment-which allows simplification of the process of manufacture will be described below.

On a transparent insulation substrate, a gate electrode layer is superposed and a gate insulation layer, a semiconductor layer, and a channel protection layer are further superposed sequentially in the order mentioned. At the step of patterning the channel protection layer, the channel protection layer is formed in self-alignment by the backside exposure method which comprises applying a resist to the surface of the channel protection layer, masking the gate electrode layer, and exposing the channel protection layer through the mask to a light which is projected from the substrate side. By the use of this method, the overlapping areas of the gate electrode layer pattern and the source and the drain electrode layer pattern can be controlled with high accuracy. This method obviates the necessity for a reticle otherwise required for patterning the channel protection layer and allows a cut of the cost of manufacture. As respects the channel width, the process of Embodiment 1 calls for no alteration because the channel width can be decided as desired by using the mask adapted to ensure device separation as demonstrated in Embodiment 1. The subsequent steps of the process of manufacture are identical with those of Embodiment 1.

According to Embodiment 2, by the adoption of the self-alignment step of manufacture, the process of manufacture can be simplified and the cost of manufacture lowered.

Embodiment 3

Now, the top gate type TFT of this invention will be described specifically below with reference to FIG. 6A through FIG. 9B. The materials to be used, the method to be adopted for the formation of layers, the etching method, etc. are identical with those illustrated in Embodiment 1.

On a substrate 7, a source electrode layer and a drain electrode layer are superposed and a contact layer is subsequently superposed. Then, the source electrode layer and the drain electrode layer and the contact layer are patterned in one equal shape to obtain the source electrode layer 2 and the drain electrode layer 2 separated by a predetermined distance and the contact layer 6 [FIG. 6A and FIG. 6B].

Figure 7A:
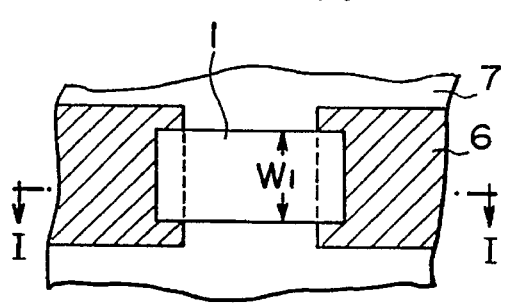
FIG. 7A is a plan view illustrating a step 2 for the formation of the TFT of Embodiment 3.
Figure 7B:
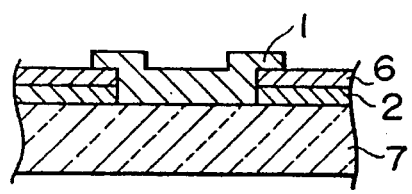
FIG. 7B is a cross section taken through FIG. 7A across the line I—I.
Figure 8A:
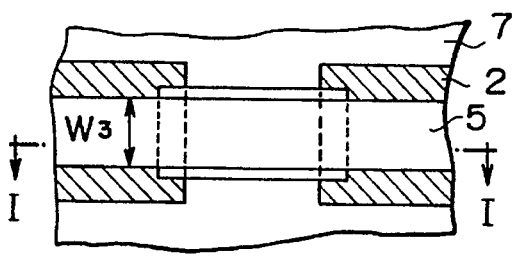
FIG. 8A is a plan view illustrating a step 3 for the formation of the TFT of Embodiment 3.
Figure 8B:
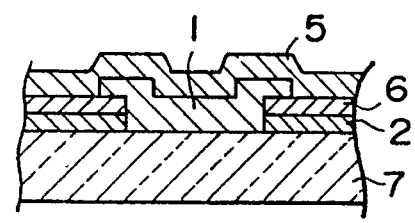
FIG. 8B is a cross section taken through FIG. 8A across the line I—I.
Figure 9A:
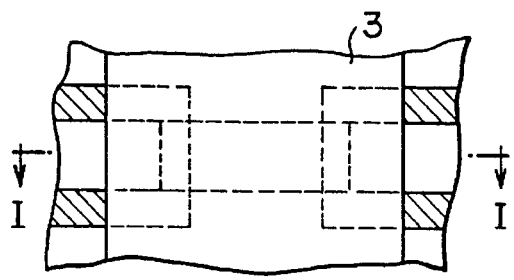
FIG. 9A is a plan view illustrating a step 4 for the formation of the TFT of Embodiment 3.
Figure 9B:
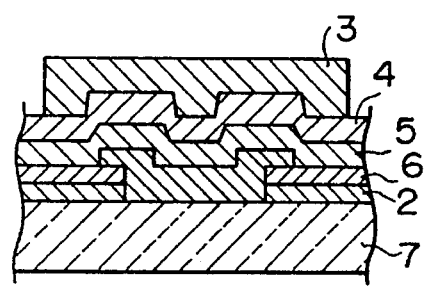
FIG. 9B is a cross section taken through FIG. 9A across the ine I—I.

A channel protection layer 1 of a width $W_1$ smaller than the width $W_0$ of the source electrode layer 2 and the drain electrode layer 2 ($W_0 > W_1$) is formed so as to cover the interval separating the source electrode layer 2 and the drain electrode layer 2 [FIG. 7A and FIG. 7B].

After a semiconductor layer 5 is deposited, this semiconductor 5 is subjected to device separation with a width $W_3$ which either equal to or smaller than the width $W_1$ of the channel protection layer 1 ($W_1 \geq W_3$). At the same time that the device separation is performed, the contact layer 6 which is not covered with the semiconductor layer 5 is removed by etching [FIG. 8A and FIG. 8B].

Then, a gate insulation layer 4 and a gate electrode layer 3 are superposed. Subsequently to this superposition, these layers are patterned respectively in desired shapes [FIG. 9A and FIG. 9B].

The construction of the TFT of this Embodiment which has been formed as described above is characterized by the fact that the source electrode layer 2 and the drain electrode layer 2 are wider than the channel protection layer 1, the semiconductor layer 5, and the contact layer 6 in the direction of channel width. Owing to this construction, the semiconductor layer 5 contacts the source and the drain electrode only across the wall thickness thereof and avoids directly contacting the contact layer 6. As a result, the leakage current path can be blocked and the leakage current due to exposure to light can be decreased.

Embodiment 4

Figure 10:
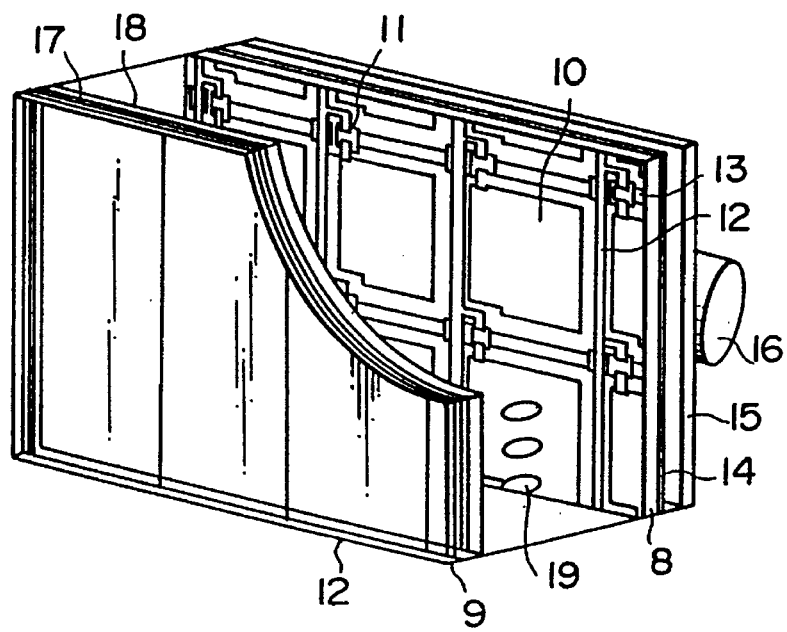
FIG. 10 is a diagram illustrating a transmissive three-terminal active matrix type liquid crystal display device according to the principle of TN type display.

A liquid crystal display device using a TFT obtained by following the procedure indicated in Embodiment 1 will be described specifically below with reference to FIG. 10.

A plurality of display electrodes 10 are laid out on the surface of a thin-film transistor (TFT) array substrate 8. TFT elements 11 obtained by following the procedure of Embodiment 1 are juxtaposed one each to the display electrodes 10. Further, on the surface of the TFT array substrate 8, a plurality of data lines 12 and address lines 13 are laid out perpendicularly mutually. Either drain electrodes or source electrodes of the TFT elements 11 are connected to the data lines 12 and gate electrodes to the address lines 13. When the liquid crystal display device is of the transmissive type, a backlight 16 is disposed on the reverse side of the TFT array substrate 8 through the medium of a polarizing element 14 and a diffusion plate 15.

On the obverse side of a counter substrate 9, counter electrodes 18 are laid out throughout the entire surface through the medium of color filter layers 17. On the reverse side of the counter substrate 9, polarizing elements 12 are disposed.

The TFT array substrate 8 and the counter substrate 9 are formed of such a transparent material as glass or quartz. Electroconductive thin films made of such materials as ITO (indium tin oxide) and other similar metallic substances are used as the display electrodes 10 and the counter electrodes 18. In the case of a transmissive type liquid crystal display device, such transparent materials as ITO are used for the two electrodes. In the case of a reflective type liquid crystal display device, it suffices to use a transparent material for electrodes of either of the two types mentioned above. More often than not, the counter electrodes are made of a transparent material. In this case, the liquid crystal display device has no use for the polarizing element 14, the diffusion plate 15, and the backlight 16 which are disposed on the reverse side of the TFT array substrate 8.

Aligning layers are formed one each on the surfaces of the TFT array substrate 8 and the counter substrate 9. A spacer is interposed between the two substrates to fix the interval between the two substrates. This spacer may be a bunch of beads or rods adapted as popularly known to be scattered between opposed surfaces to insert a uniform gap therebetween or a plurality of columnar spacers formed at predetermined positions by superposing a polymer layer on the surface of a substrate and then removing the polymer layer except for the portions falling on the predetermined positions by the photolithographic technique. A liquid crystal composition 19 is sealed in between the orientation layers of the TFT array substrate 8 and the counter substrate 9.

Since the liquid crystal display device is capable of lowering the magnitude of leakage current, it enjoys improved contrast and excels in quality of display.

Embodiment 5

Figure 11:
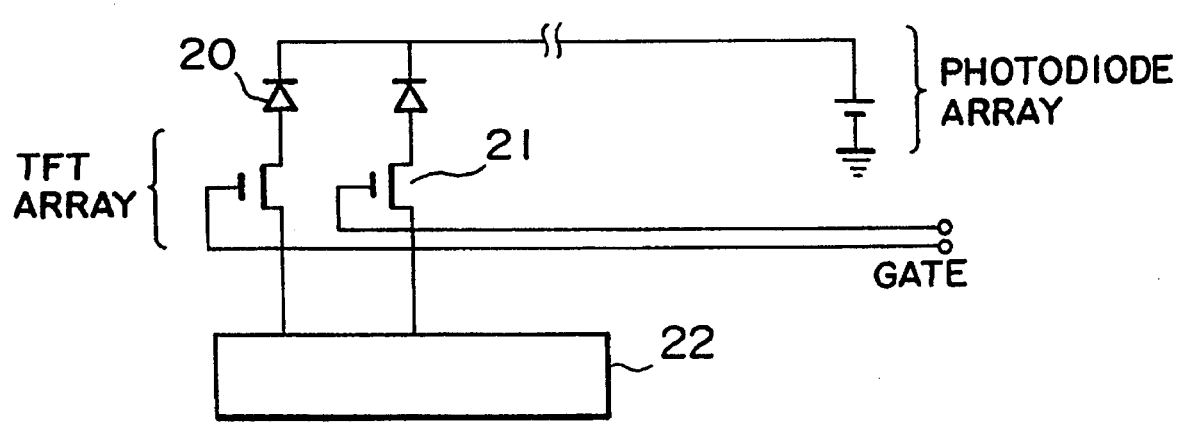
FIG. 11 is an equivalent circuit of an MOS transistor type image sensor.

An image sensor using a TFT obtained by following the procedure indicated in Embodiment 1 will be described below with reference to FIG. 11.

An image sensor is composed of a photodiode array consisting of a plurality of photodiodes 20, a TFT array consisting of a plurality of TFT's 21, and a multiplexer 22. When light impinges on unit pixels each formed of a photodiodes 20 and a TFT 21, carriers generated in the relevant elementary areas are accumulated in source electrode layer parts of the TFT's 21. The TFT's 21 are sequentially actuated and the signals of the photodiodes are extracted in the form of image signals by the multiplexer 22 when the component X-Y lines are scanned by a horizontal scanning circuit and a vertical scanning circuit.

The produced image sensor is capable of lowering the magnitude of leakage current of the TFT's 21 and, therefore, enjoys a high utilization factor of light and excels in sensitivity and S/N ratio.

What is claimed is:

1. A thin-film semiconductor element comprising:

a substrate;

a gate electrode layer on said substrate;

an insulating layer on said gate electrode layer;

a channel area comprising a semiconductor layer over said gate electrode and on said insulating layer;

a channel protection layer on said channel area;

a source and drain electrode layer on said channel protection layer defining a channel length between the source electrode layer and the drain electrode layer and a channel width transverse to the channel length; and a contact layer between said channel protection layer and said source and drain electrode layer;

said semiconductor layer, said channel protection layer, and said contact layer being coextensive in the direction of said channel width; and said source and drain electrode layer having a greater length in the direction of said channel width than said contact layer; wherein the source and drain electrode layer overlaps said contact layer, said channel protection layer, and said semiconductor layer in the direction of said channel width; and wherein said source and drain electrode layer directly contacts said insulating layer at the point of overlap.

2. A thin-film transistor element according to claim 1, wherein the side walls of said source and drain electrode layer extend beyond both of the side walls of said channel protection layer, and said source and drain electrode layer overlaps said semiconductor layer and said channel protection layer.

3. A thin-film transistor element according to claim 2, which satisfies the relation $W_1 > W_0$ wherein $W_1$ stands for the width of said source and drain electrode layer and $W_0$ for the width of said channel protection layer.

4. A thin-film transistor element according to claim 1, wherein the side walls of said source and drain electrode layer extend beyond either of the side walls of said channel protection layer, and said source and drain electrode layer overlaps with said semiconductor layer and said channel protection layer.

5. A thin-film transistor element according to claim 1, wherein said semiconductor layer exclusively contacts said source and drain electrode layer and avoids contacting a contact layer between said source and drain electrode layer and said semiconductor layer, at points where said source and drain electrode layer overlaps and contacts said semiconductor layer.

6. A thin-film transistor element according to claim 1, wherein said semiconductor layer comprises amorphous silicon.

7. A thin-film transistor element comprising:

a substrate;

a source and drain electrode layer on said substrate defining a channel length between the source electrode layer and the drain electrode layer and a channel width transverse to the length;

a channel protection layer on said source and drain electrode layer;

a contact layer between said channel protection layer and said source and drain electrode layer;

a channel area comprising a semiconductor layer over said source and drain electrode layer and on said channel protection layer; and a gate insulation layer on said channel area, said semiconductor layer, said channel protection layer, and said contact layer being coextensive in the direction of said channel width; and said source and drain electrode layer having a greater length in the direction of said channel width than said contact layer; wherein the source and drain electrode layer extends beyond said contact layer, said channel protection layer, and said semiconductor layer in the direction of said channel width; and wherein said source and drain electrode layer directly contacts said insulating layer at the point beyond the extend of said contact layer.

8. A thin-film transistor element according to claim 7, wherein the side walls of said source and drain electrode layer extend beyond both of the side walls of said channel protection layer, and said source and drain electrode layer overlaps said semiconductor layer and said channel protection layer.

9. A thin-film transistor element according to claim 8, which satisfies the relation $W_1 > W_0$ wherein $W_1$ stands for the width of said source and drain electrode layer and $W_0$ for the width of said channel protection layer.

10. A thin-film transistor element according to claim 7, wherein the side walls of said source and drain electrode layer extend beyond either of the side walls of said channel protection layer and said source and drain electrode layer overlaps with said semiconductor layer and said channel protection layer.

11. A thin-film transistor element according to claim 7, wherein said semiconductor layer exclusively contacts said source and drain electrode layer and avoids contacting said contact layer between said source and drain electrode layer and said semiconductor layer, at points where said source and drain electrode layer overlaps and contacts said semiconductor layer.

12. A thin-film transistor element according to claim 7, wherein said semiconductor layer comprises amorphous silicon.

13. A liquid crystal display device comprising:

a thin-film transistor element array substrate;

a counter substrate; and a liquid crystal composition interposed between said two substrates, said thin-film transistor element disposed on said thin-film transistor element array substrate being a thin-film transistor element according to claim 1.

14. An image sensor comprising:

a photodiode array consisting of a plurality of photodiodes;

a thin-film transistor element consisting of a plurality of thin-film transistor elements; and a multiplexer, said thin-film transistor element being a thin-film transistor element according to claim 1.

15. A thin-film transistor element comprising:

a substrate;

a gate electrode layer on said substrate;

an insulating layer on said gate electrode layer;

a channel area comprising a semiconductor layer over said gate electrode layer and on said insulating layer;

a channel protection layer on said channel area;

a source and drain electrode layer on said channel protection layer defining a channel length between the source electrode layer and the drain electrode layer and a channel width transverse to the channel length; and a contact layer between said channel protection layer and said source and drain electrode layer, said semiconductor layer, said channel protection layer, and said contact layer being coextensive in the direction of said channel width; and said source and drain electrode layer having a greater length in the direction of said channel width than said contact layer, wherein said semiconductor layer has three areas in the direction of said channel length:

(a) a low resistance area where a photo-carrier is excited by irradiation of light;

(b) high resistance areas where the thin-film transistor element is off state, the high resistance areas being on both side of said low resistance area; and (c) areas where the semiconductor layer contacts said contact layer, the areas being the outermost side of the semiconductor layer and adjacent to the high resistance areas.

* * * * *

UNITED STATES PATENT AND TRADEMARK OFFICE
CERTIFICATE OF CORRECTION

PATENT NO.   : 5,614,731
DATED        : March 25, 1997
INVENTOR(S)  : Shuichi UCHIKOGA et al.

It is certified that error appears in the above-indentified patent and that said Letters Patent is hereby corrected as shown below:

Claim 7, column 11, line 58, before "length", insert --channel--.

Claim 15, column 14, line 5, "side" should read --sides--.

Signed and Sealed this

Fourteenth Day of October, 1997

Attest:

BRUCE LEHMAN

Attesting Officer

Commissioner of Patents and Trademarks